(12) United States Patent
Momiyama et al.

(10) Patent No.: US 11,302,559 B2
(45) Date of Patent: *Apr. 12, 2022

(54) ELECTROSTATIC CHUCK

(71) Applicant: TOTO LTD., Kitakyushu (JP)

(72) Inventors: Yutaka Momiyama, Kitakyushu (JP);
Minoru Suzuki, Kitakyushu (JP);
Hitoshi Sasaki, Kitakyushu (JP);
Tsukasa Shigezumi, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/009,365

(22) Filed: Sep. 1, 2020

(65) Prior Publication Data
US 2021/0074571 A1 Mar. 11, 2021

(30) Foreign Application Priority Data
Sep. 5, 2019 (JP) .............................. JP2019-162315

(51) Int. Cl.
*H01L 21/683* (2006.01)
(52) U.S. Cl.
CPC ................................ *H01L 21/6833* (2013.01)
(58) Field of Classification Search
CPC ........... H01L 21/6833; H01L 21/68735; H01L 21/67109; H01J 37/32715
USPC ................................................. 361/233, 234
See application file for complete search history.

(56) References Cited

U.S. PATENT DOCUMENTS

2009/0199967 A1 8/2009 Himori et al.
2011/0096461 A1 4/2011 Yoshikawa et al.

FOREIGN PATENT DOCUMENTS

| JP | 2009-188342 A | 8/2009 |
| JP | 2011-119654 A | 6/2011 |
| JP | 2016201411 A | * 12/2016 |

* cited by examiner

*Primary Examiner* — Kevin J Comber
(74) *Attorney, Agent, or Firm* — Carrier Blackman & Associates, P.C.; William D. Blackman; Joseph P. Carrier

(57) ABSTRACT

According to one embodiment, an electrostatic chuck includes a ceramic dielectric substrate, a base plate, and first and second electrode layers. The ceramic dielectric substrate includes first and second major surfaces. The first and second electrode layers are provided inside the ceramic dielectric substrate. The first electrode layer includes first and second portions. The first portion is positioned more centrally of the ceramic dielectric substrate than is the second portion. The first portion includes first and second surfaces. The second portion includes third and fourth surfaces. A distance between the fourth surface and the first major surface is constant. A thickness of the second portion between the third and fourth surfaces varies such that the thickness at a circumferential end portion of the second portion which is less than that at a central portion of the second portion.

3 Claims, 10 Drawing Sheets

FIG. 7A
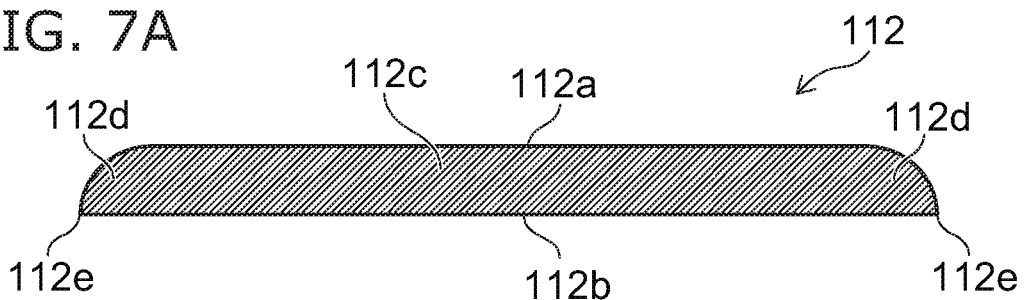
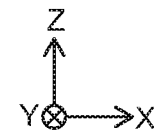
FIG. 7B
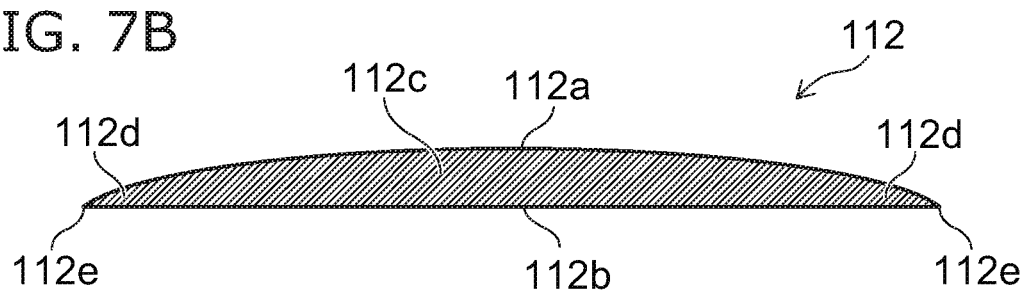
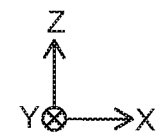

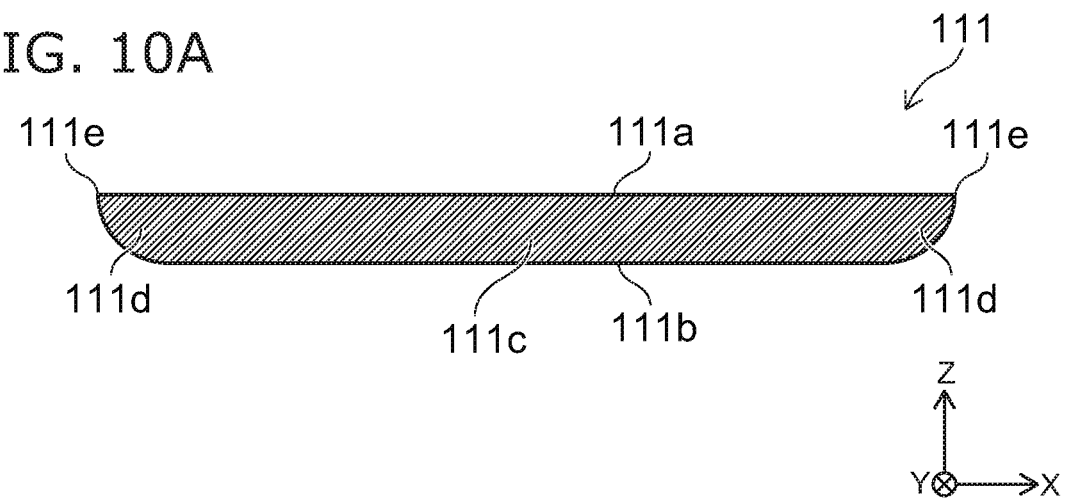
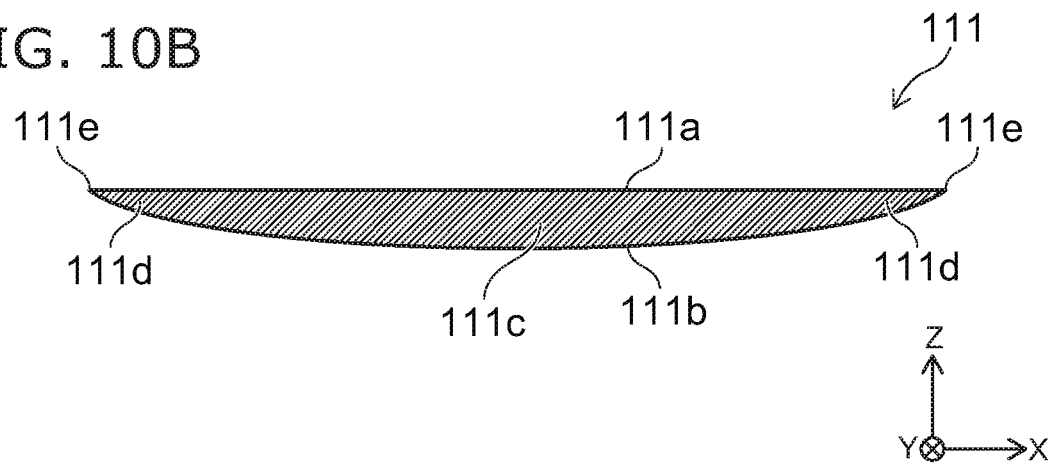

ELECTROSTATIC CHUCK

CROSS-REFERENCE TO RELATED APPLICATIONS

This application is based upon and claims the benefit of priority from Japanese Patent Application No. 2019-162315, filed on Sep. 5, 2019; the entire contents of which are incorporated herein by reference.

FIELD

Embodiments described herein relate generally to an electrostatic chuck.

BACKGROUND

An electrostatic chuck is used to attract and hold a processing object such as a semiconductor wafer, a glass substrate, etc., inside a plasma processing chamber that performs etching, CVD (Chemical Vapor Deposition), sputtering, ion implantation, ashing, etc. The electrostatic chuck applies electrical power for electrostatic attraction to a built-in electrode and attracts and holds a substrate such as a silicon wafer, etc., by an electrostatic force.

When performing plasma processing, for example, plasma is generated by applying a voltage from an RF (Radio Frequency) power supply (a high frequency power supply) to an upper electrode provided at an upper portion inside a chamber and to a lower electrode provided lower than the upper electrode.

In a conventional electrostatic chuck, the plasma is generated using, as the lower electrode, a base plate provided in a lower portion of the electrostatic chuck. However, the plasma controllability is limited in such a configuration because it is desirable to perform better control of the wafer in-plane distribution of the plasma density by selecting the appropriate frequency.

Therefore, in recent years, it is being attempted to increase the plasma controllability by embedding a lower electrode for plasma generation in a dielectric layer provided on a base plate. However, when merely embedding the lower electrode in the dielectric layer, there are problematic cases in which the in-plane uniformity of the plasma density cannot be sufficiently obtained. Also, there are problematic cases in which electric field concentration and dielectric breakdown occur at end portions of the lower electrode embedded in the dielectric layer.

SUMMARY

According to the embodiment, an electrostatic chuck includes a ceramic dielectric substrate, a base plate, at least one first electrode layer, and at least one second electrode layer. The ceramic dielectric substrate includes a first major surface and a second major surface. The first major surface is configured to have an object placed thereon and clamped by the electrostatic chuck. The second major surface is at a side opposite to the first major surface. The base plate supports the ceramic dielectric substrate. The first electrode layer is provided inside the ceramic dielectric substrate. The first electrode layer is connected to a high frequency power supply from a side of the second major surface. The second electrode layer is provided inside the ceramic dielectric substrate. The second electrode layer is connected to a clamping power supply. The first electrode layer is provided between the first major surface and the second major surface in a Z-axis direction. The Z-axis direction extends from the base plate toward the ceramic dielectric substrate. The second electrode layer is provided between the first electrode layer and the first major surface in the Z-axis direction. The first electrode layer includes a first portion and a second portion. The first portion is positioned more centrally of the ceramic dielectric substrate than is the second portion when projected onto a plane perpendicular to the Z-axis direction. The first portion includes a first surface at a side of the first major surface, and a second surface at a side opposite to the first surface. The second portion includes a third surface at the side of the first major surface, and a fourth surface at a side opposite to the third surface. The third surface is positioned between the first surface and the second electrode layer in the Z-axis direction. A distance along the Z-axis direction between the fourth surface and the first major surface is constant. A second thickness of the second portion in the Z-axis direction between the third surface and the fourth surface varies such that the second thickness at a circumferential end portion of the second portion is less than the second thickness at a central portion of the second portion.

BRIEF DESCRIPTION OF THE DRAWINGS

FIGS. 7A and 7B are cross-sectional views schematically illustrating examples of the second portion of the electrostatic chuck according to the embodiment;

FIGS. 10A and 10B are cross-sectional views schematically illustrating examples of the first portion of the electrostatic chuck according to the embodiment.

DETAILED DESCRIPTION

Figure 1:
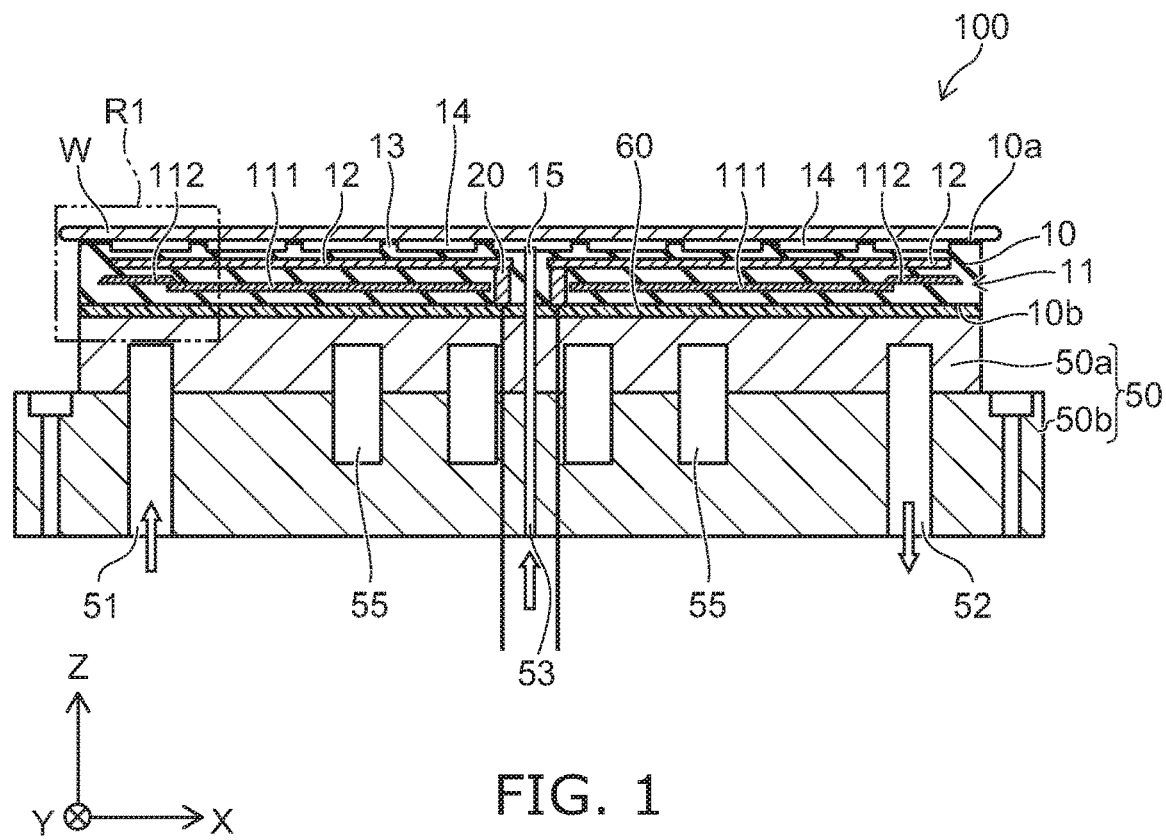
FIG. 1 is a cross-sectional view schematically illustrating an electrostatic chuck according to an embodiment.

A first invention is an electrostatic chuck including a ceramic dielectric substrate including a first major surface and a second major surface, a base plate supporting the ceramic dielectric substrate, at least one first electrode layer provided inside the ceramic dielectric substrate and connected to a high frequency power supply from a side of the second major surface, and at least one second electrode layer provided inside the ceramic dielectric substrate and connected to a clamping power supply; the first major surface is configured to have an object placed thereon and clamped by the electrostatic chuck; the second major surface is at a side opposite to the first major surface; the first electrode layer is provided between the first major surface and the second major surface in a Z-axis direction, which extends from the base plate toward the ceramic dielectric substrate; the second electrode layer is provided between the first electrode layer and the first major surface in the Z-axis direction; the first electrode layer includes a first portion and a second portion; the first portion is positioned more centrally of the ceramic dielectric substrate than is the second portion when projected onto a plane perpendicular to the Z-axis direction; the first portion includes a first surface at a side of the first major surface, and a second surface at a side opposite to the first surface; the second portion includes a third surface at the side of the first major surface, and a fourth surface at a side opposite to the third surface; the third surface is positioned between the first surface and the second electrode layer in the Z-axis direction; a distance along the Z-axis direction between the fourth surface and the first major surface is constant; and a second thickness of the second portion in the Z-axis direction between the third surface and the fourth surface varies such that the second thickness at a circumferential end portion of the second portion which is less than the second thickness at a central portion of the second portion.

It is known that when a high frequency current is applied, the electric field strength is strong at the center vicinity of the electrode, and the electric field strength is weak at the outer circumference portion of the electrode. According to this electrostatic chuck, the first electrode layer includes the first portion positioned at the center vicinity when projected onto the plane perpendicular to the Z-axis direction, and the second portion positioned further toward the outer circumference side than the first portion when projected onto the plane perpendicular to the Z-axis direction. Also, the surface (the third surface) on the side of the first major surface of the second portion is positioned between the second electrode layer and the surface (the first surface) on the side of the first major surface of the first portion in the Z-axis direction. Thereby, the distance between the upper electrode and the first surface of the first portion positioned at the center vicinity of the first electrode layer can be greater than the distance between the upper electrode and the third surface of the second portion positioned at the outer circumference side of the first electrode layer, and the electric field strength can be reduced at the center vicinity (the first portion) of the first electrode layer at which the electric field strength easily becomes strong compared to the outer circumference portion (the second portion) of the first electrode layer. Accordingly, the plasma controllability can be increased, and the in-plane uniformity of the plasma density in the first electrode layer can be increased.

The inventors discovered that there is a risk that electric field concentration and dielectric breakdown may occur at the circumferential end portion of the second portion at this time. According to this electrostatic chuck, the occurrence of the electric field concentration at the circumferential end portion of the second portion can be suppressed by setting the distance along the Z-axis direction between the fourth surface and the first major surface to be constant, and by setting the second thickness of the second portion in the Z-axis direction between the third surface and the fourth surface to vary such that the second thickness at a circumferential end portion of the second portion which is less than the second thickness at the central portion of the second portion. The occurrence of the dielectric breakdown due to the electric field concentration at the circumferential end portion of the second portion can be suppressed thereby.

A second invention is the electrostatic chuck of the first invention, wherein a distance along the Z-axis direction between the second surface and the first major surface is constant, and a first thickness of the first portion in the Z-axis direction between the first surface and the second surface varies such that the first thickness at a circumferential end portion of the first portion which is less than the first thickness at a central portion of the first portion.

According to this electrostatic chuck, the occurrence of the electric field concentration at the circumferential end portion of the first portion can be suppressed by setting the distance along the Z-axis direction between the second surface and the first major surface to be constant, and by setting the first thickness of the first portion in the Z-axis direction between the first surface and the second surface to vary such that the first thickness at a circumferential end portion of the first portion which is less than the first thickness at the central portion of the first portion. The occurrence of the dielectric breakdown due to the electric field concentration at the circumferential end portion of the first portion can be further suppressed thereby.

A third invention is the electrostatic chuck of the first invention, wherein a distance along the Z-axis direction between the first surface and the first major surface is constant, and a first thickness of the first portion in the Z-axis direction between the first surface and the second surface varies such that the first thickness at a circumferential end portion of the first portion which is less than the first thickness at a central portion of the first portion.

According to this electrostatic chuck, the distance along the Z-axis direction between the first surface and the first major surface is set to be constant, and the first thickness of the first portion in the Z-axis direction between the first surface and the second surface to vary such that the first thickness at a circumferential end portion of the first portion is set which is less than the first thickness at the central portion of the first portion; thereby, the surface area of the second surface of the first portion, which is positioned at the base plate side which has a cooling function, can be relatively large. Thereby, the first electrode layer can dissipate heat more effectively, and the in-plane uniformity of the plasma density can be increased further. Also, the power supply distance from the second surface to the first surface can be shortened. Thereby, the responsiveness (the RF responsiveness) to a control such as a modification of the RF output, etc., can be increased.

Embodiments of the invention will now be described with reference to the drawings. Similar components in the drawings are marked with the same reference numerals; and a detailed description is omitted as appropriate.

FIG. 1 is a cross-sectional view schematically illustrating an electrostatic chuck according to an embodiment.

As illustrated in FIG. 1, the electrostatic chuck 100 includes a ceramic dielectric substrate 10, a first electrode layer 11, a second electrode layer 12, and a base plate 50.

The ceramic dielectric substrate 10 is, for example, a base material having a flat plate configuration made of a sintered ceramic. For example, the ceramic dielectric substrate 10 includes aluminum oxide (alumina ($Al_2O_3$)). For example, the ceramic dielectric substrate 10 is formed of high-purity aluminum oxide. The concentration of the aluminum oxide in the ceramic dielectric substrate 10 is, for example, not less than 90 mass percent (mass %) and not more than 100 mass %, and favorably not less than 95 mass percent (mass %) and not more than 100 mass %, and more favorably not less than 99 mass percent (mass %) and not more than 100 mass %. By using high-purity aluminum oxide, the plasma resistance of the ceramic dielectric substrate 10 can be improved. The concentration of the aluminum oxide can be measured by fluorescent X-ray analysis, etc.

The ceramic dielectric substrate 10 has a first major surface 10a and a second major surface 10b. The first major surface 10a is a surface where a clamping object W is placed. The first major surface 10a is configured to have an object W placed thereon and clamped by the electrostatic chuck. The second major surface 10b is a surface on the side opposite to the first major surface 10a. The clamping object W is, for example, a semiconductor substrate such as a silicon wafer, etc.

In this specification, the direction from the base plate 50 toward the ceramic dielectric substrate 10 is taken as a Z-axis direction. The Z-axis direction extends from the base plate 50 toward the ceramic dielectric substrate 10. For example, as illustrated in the drawings, the Z-axis direction is the direction connecting the first major surface 10a and the second major surface 10b. The Z-axis direction is, for example, a direction substantially perpendicular to the first major surface 10a and the second major surface 10b. One direction orthogonal to the Z-axis direction is taken as an X-axis direction; and a direction orthogonal to the Z-axis direction and the X-axis direction is taken as a Y-axis direction. In this specification, "in the plane" is, for example, in the X-Y plane.

The first electrode layer 11 and the second electrode layer 12 are provided inside the ceramic dielectric substrate 10. The first electrode layer 11 and the second electrode layer 12 are provided between the first major surface 10a and the second major surface 10b. In other words, the first electrode layer 11 and the second electrode layer 12 are inserted into the ceramic dielectric substrate 10. For example, the first electrode layer 11 and the second electrode layer 12 may be built into the ceramic dielectric substrate 10 by sintering as one body.

The first electrode layer 11 is positioned between the first major surface 10a and the second major surface 10b in the Z-axis direction. The second electrode layer 12 is positioned between the first major surface 10a and the first electrode layer 11 in the Z-axis direction. In other words, the first electrode layer 11 is positioned between the second electrode layer 12 and the second major surface 10b in the Z-axis direction.

Thus, by providing the first electrode layer 11 inside the ceramic dielectric substrate 10, the distance between the first electrode layer 11 (the lower electrode) and the upper electrode (an upper electrode 510 of FIG. 11) that is provided higher than the electrostatic chuck 100 can be shortened. Thereby, for example, compared to when the base plate 50 is used as the lower electrode, etc., the plasma density can be increased with low electrical power. In other words, the electrical power that is necessary to obtain a high plasma density can be reduced.

The first electrode layer 11 and the second electrode layer 12 have thin-film configurations along the first major surface 10a and the second major surface 10b of the ceramic dielectric substrate 10. The configuration of the first electrode layer 11 is described below. The second electrode layer 12 is parallel to the first major surface 10a and the second major surface 10b. More specifically, the surface (the upper surface) on the first major surface 10a side (a side of the first major surface 10a) of the second electrode layer 12 and the surface (the lower surface) on the second major surface 10b side (a side of the second major surface 10b) of the second electrode layer 12 are respectively parallel to the first major surface 10a and the second major surface 10b.

The first electrode layer 11 is connected to a high frequency power supply (a high frequency power supply 504 of FIG. 11) from the side of the second major surface 10b. Plasma is generated inside a processing container 501 by a voltage (a high frequency voltage) being applied from the high frequency power supply to the first electrode layer 11 and the upper electrode (the upper electrode 510 of FIG. 11). In other words, the first electrode layer 11 is a lower electrode for generating the plasma. The high frequency power supply supplies a high frequency AC (alternating current) current to the first electrode layer 11. Here, "high frequency" is, for example, 200 kHz or more.

For example, the first electrode layer 11 is made of metal. The first electrode layer 11 includes, for example, at least one of Ag, Pd, or Pt. The first electrode layer 11 may include, for example, metal and ceramic.

Figure 11:
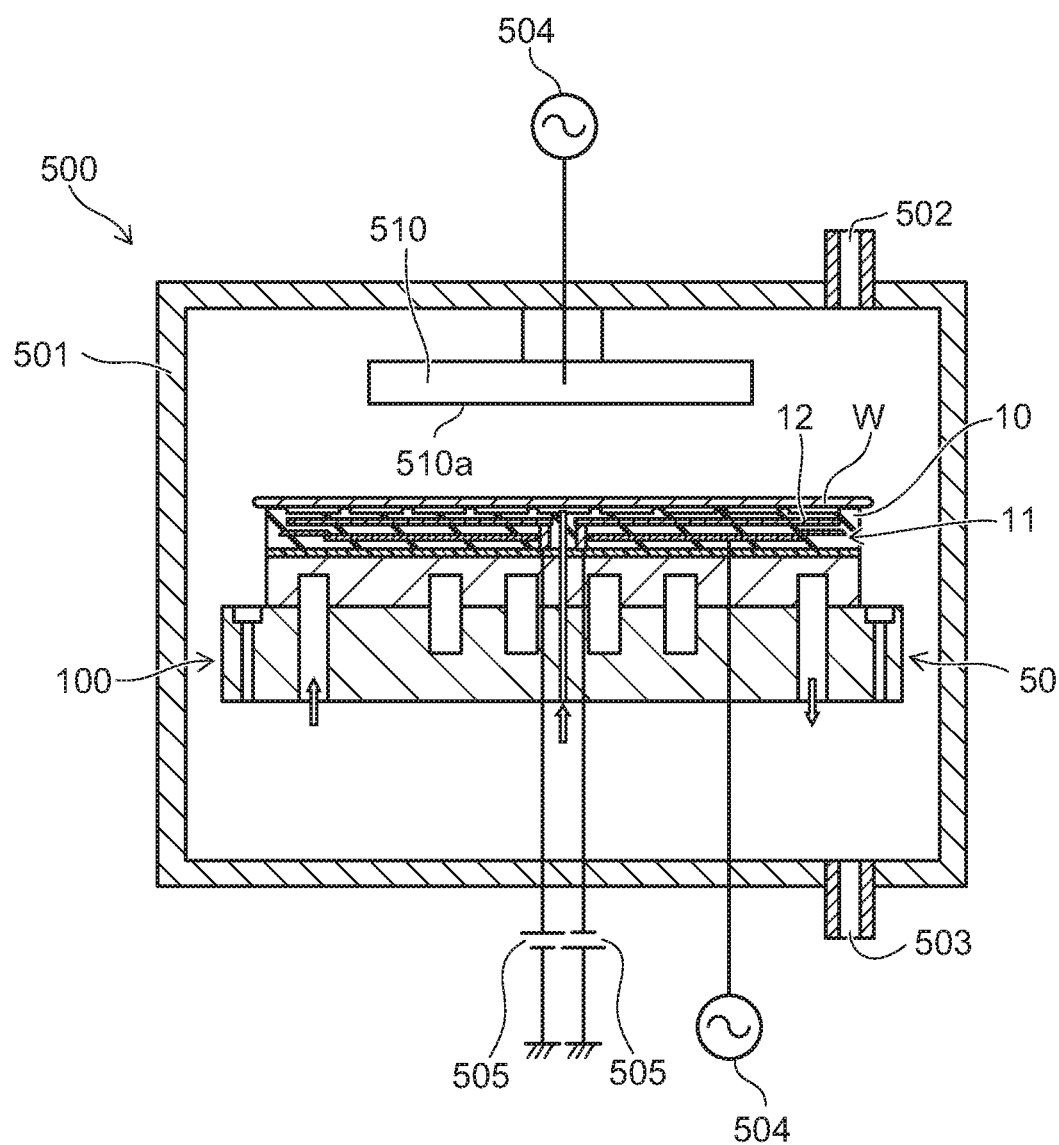
FIG. 11 is a cross-sectional view schematically illustrating a wafer processing apparatus including the electrostatic chuck according to the embodiment.

The second electrode layer 12 is connected to a clamping power supply (a clamping power supply 505 of FIG. 11). By applying a voltage (a clamping voltage) from the clamping power supply to the second electrode layer 12, the electrostatic chuck 100 generates a charge at the first major surface 10a side of the second electrode layer 12 and clamps the clamping object W by an electrostatic force. In other words, the second electrode layer 12 is a clamping electrode for clamping the clamping object W. The clamping power supply supplies a direct current (DC) current or an AC current to the second electrode layer 12. The clamping power supply is, for example, a DC power supply. The clamping power supply may be, for example, an AC power supply.

For example, the second electrode layer 12 is made of metal. The second electrode layer 12 includes, for example, at least one of Ag, Pd, Pt, Mo, or W. The second electrode layer 12 may include, for example, metal and ceramic.

A connection portion 20 that extends to the second major surface 10b side of the ceramic dielectric substrate 10 is provided at the second electrode layer 12. The connection portion 20 is, for example, a via (solid) or a via hole (hollow) that is electrically connected to the second electrode layer 12. The connection portion 20 may be a metal terminal connected by an appropriate method such as brazing, etc.

The base plate 50 is a member supporting the ceramic dielectric substrate 10. The ceramic dielectric substrate 10 is fixed on the base plate 50 by a bonding member 60. For example, a silicone bonding agent is used as the bonding member 60.

For example, the base plate 50 is made of metal such as aluminum, etc. For example, the base plate 50 may be made of ceramic. For example, the base plate 50 is divided into an upper portion 50a and a lower portion 50b; and a passageway 55 is provided between the upper portion 50a and the lower portion 50b. One end of the passageway 55 is connected to an input channel 51; and the other end of the passageway 55 is connected to an output channel 52.

The base plate 50 also performs the role of the temperature adjustment of the electrostatic chuck 100. For example, when cooling the electrostatic chuck 100, a cooling medium such as helium gas or the like is caused to inflow through the input channel 51, pass through the passageway 55, and outflow from the output channel 52. Thereby, the heat of the base plate 50 can be absorbed by the cooling medium; and the ceramic dielectric substrate 10 that is mounted on the base plate 50 can be cooled. On the other hand, when maintaining the temperature of the electrostatic chuck 100, it is also possible to introduce a heat-retaining medium into the passageway 55. It is also possible to provide a built-in heating element in the ceramic dielectric substrate 10 and/or the base plate 50. The temperature of the clamping object W held by the electrostatic chuck 100 can be adjusted by adjusting the temperature of the base plate 50 and/or the ceramic dielectric substrate 10.

In the example, a channel 14 is provided at the first major surface 10a side of the ceramic dielectric substrate 10. The channel 14 is recessed in the direction from the first major surface 10a toward the second major surface 10b (the Z-axis direction) and extends to be continuous in the X-Y plane. The portion where the channel 14 is not provided is taken as a protrusion 13; and the clamping object W is placed on the protrusion 13. The first major surface 10a is a surface contacting the back surface of the clamping object W. In other words, the first major surface 10a is a plane including the upper surface of the protrusion 13. A space is formed between the channel 14 and the back surface of the clamping object W placed on the electrostatic chuck 100.

The ceramic dielectric substrate 10 has a through-hole 15 connected to the channel 14. The through-hole 15 is provided from the second major surface 10b to the first major surface 10a. In other words, the through-hole 15 extends in the Z-axis direction from the second major surface 10b to the first major surface 10a and pierces the ceramic dielectric substrate 10.

The temperature of the clamping object W and/or the particles adhered to the clamping object W can be controlled to a favorable state by appropriately selecting the height of the protrusion 13 (the depth of the channel 14), the surface area ratio of the protrusion 13 and the channel 14, the shapes, etc.

A gas introduction channel 53 is provided in the base plate 50. For example, the gas introduction channel 53 is provided to pierce the base plate 50. The gas introduction channel 53 may not pierce through the base plate 50, and may be provided to reach the ceramic dielectric substrate 10 side by branching partway into other gas introduction channels 53. The gas introduction channel 53 may be provided in multiple locations of the base plate 50.

The gas introduction channel 53 communicates with the through-hole 15. In other words, the transfer gas (helium (He) or the like) that inflows into the gas introduction channel 53 inflows into the through-hole 15 after passing through the gas introduction channel 53.

The transfer gas that inflows into the through-hole 15 inflows into the space provided between the clamping object W and the channel 14 after passing through the through-hole 15. Thereby, the clamping object W can be directly cooled by the transfer gas.

Figure 2:
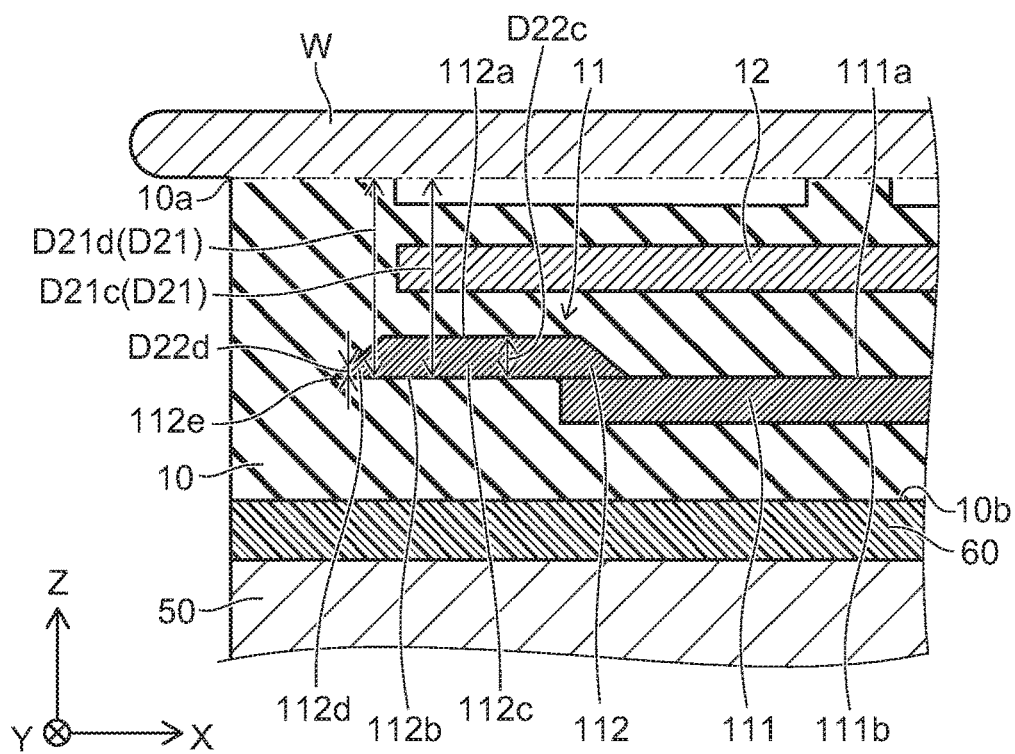
FIG. 2 is an enlarged cross-sectional view schematically illustrating a portion of the electrostatic chuck according to the embodiment.

FIG. 2 is an enlarged cross-sectional view schematically illustrating a portion of the electrostatic chuck according to the embodiment.

Figure 3A:
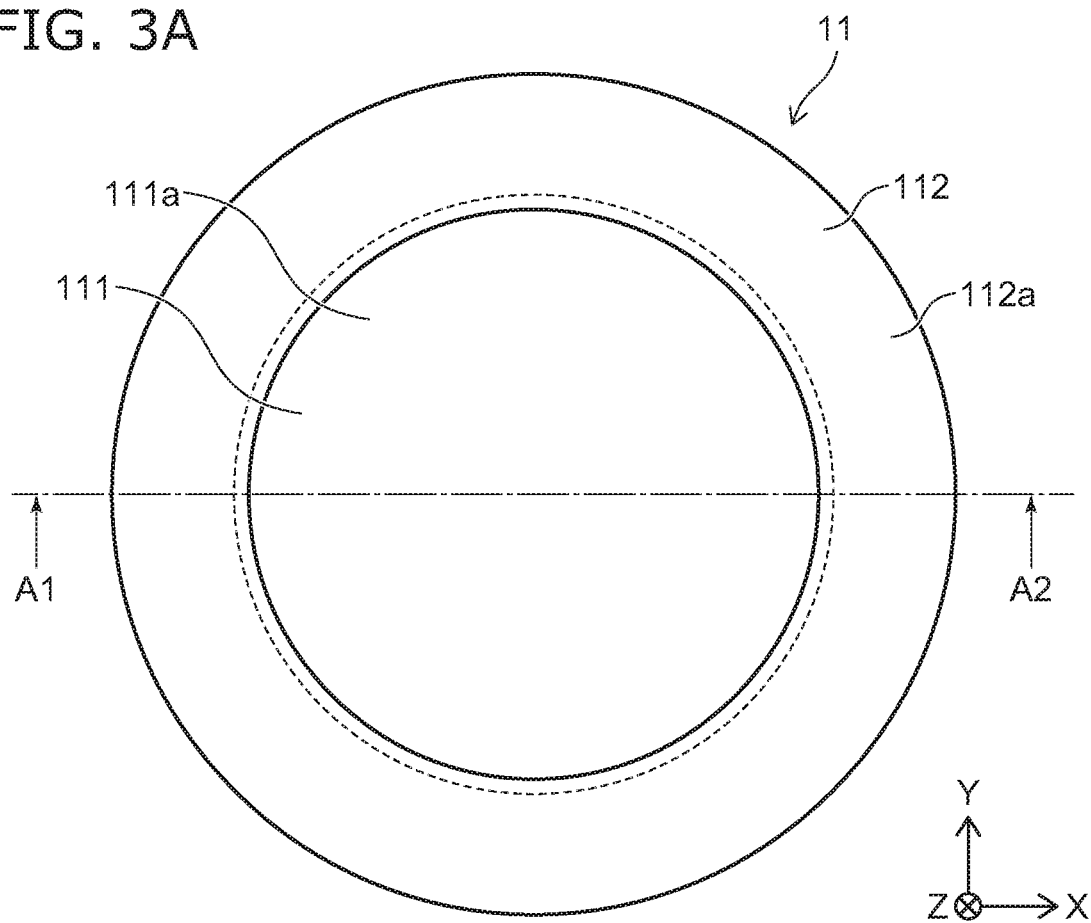
FIGS. 3A and 3B are a plan view and a cross-sectional view schematically illustrating an example of the first electrode layer of the electrostatic chuck according to the embodiment.
Figure 3B:
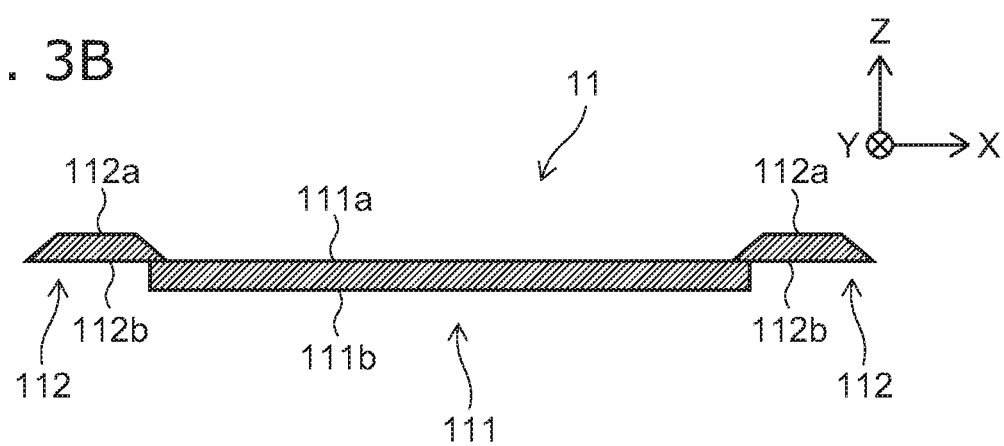

FIGS. 3A and 3B are a plan view and a cross-sectional view schematically illustrating an example of the first electrode layer of the electrostatic chuck according to the embodiment.

Figure 4A:
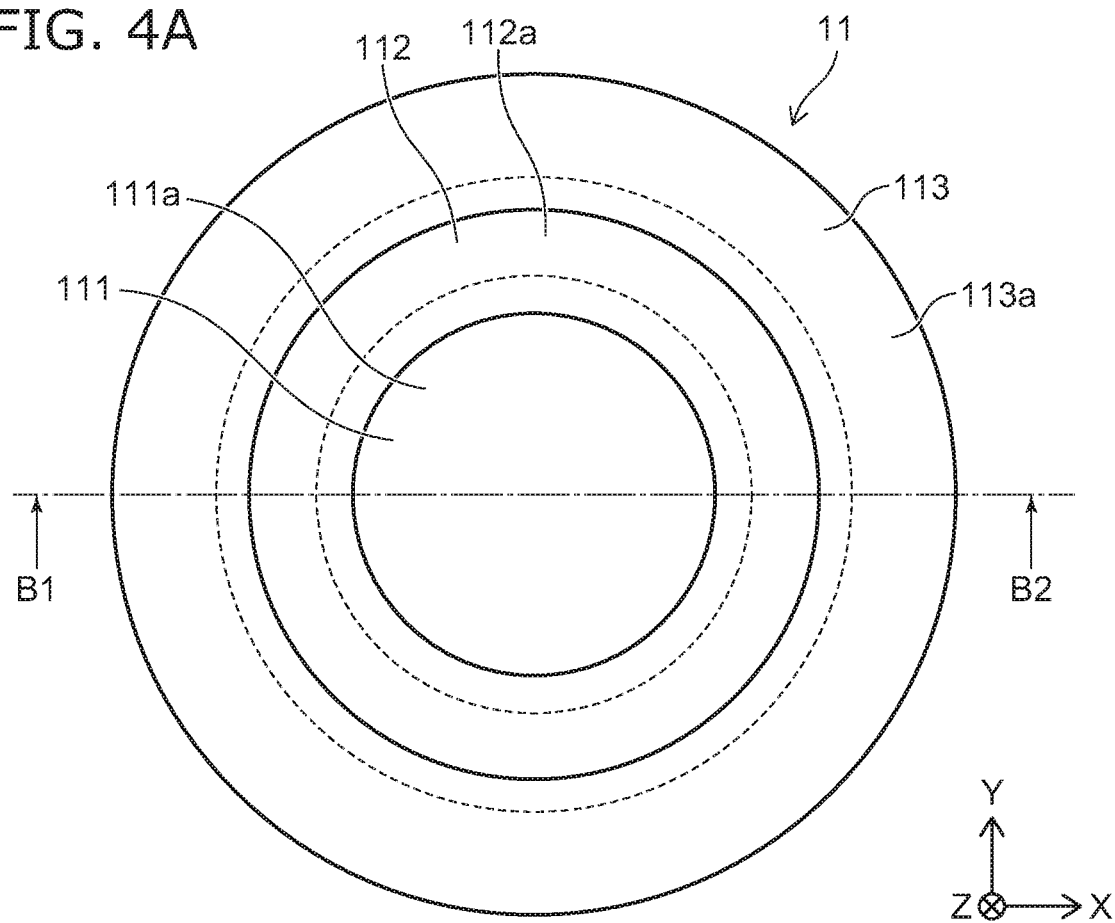
FIGS. 4A and 4B are a plan view and a cross-sectional view schematically illustrating another example of the first electrode layer of the electrostatic chuck according to the embodiment.
Figure 4B:
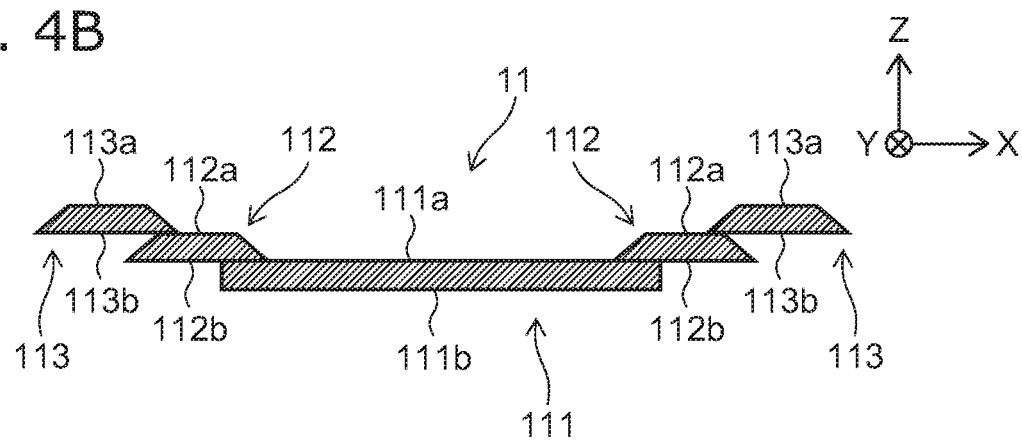

FIGS. 4A and 4B are a plan view and a cross-sectional view schematically illustrating another example of the first electrode layer of the electrostatic chuck according to the embodiment.

Figure 5A:
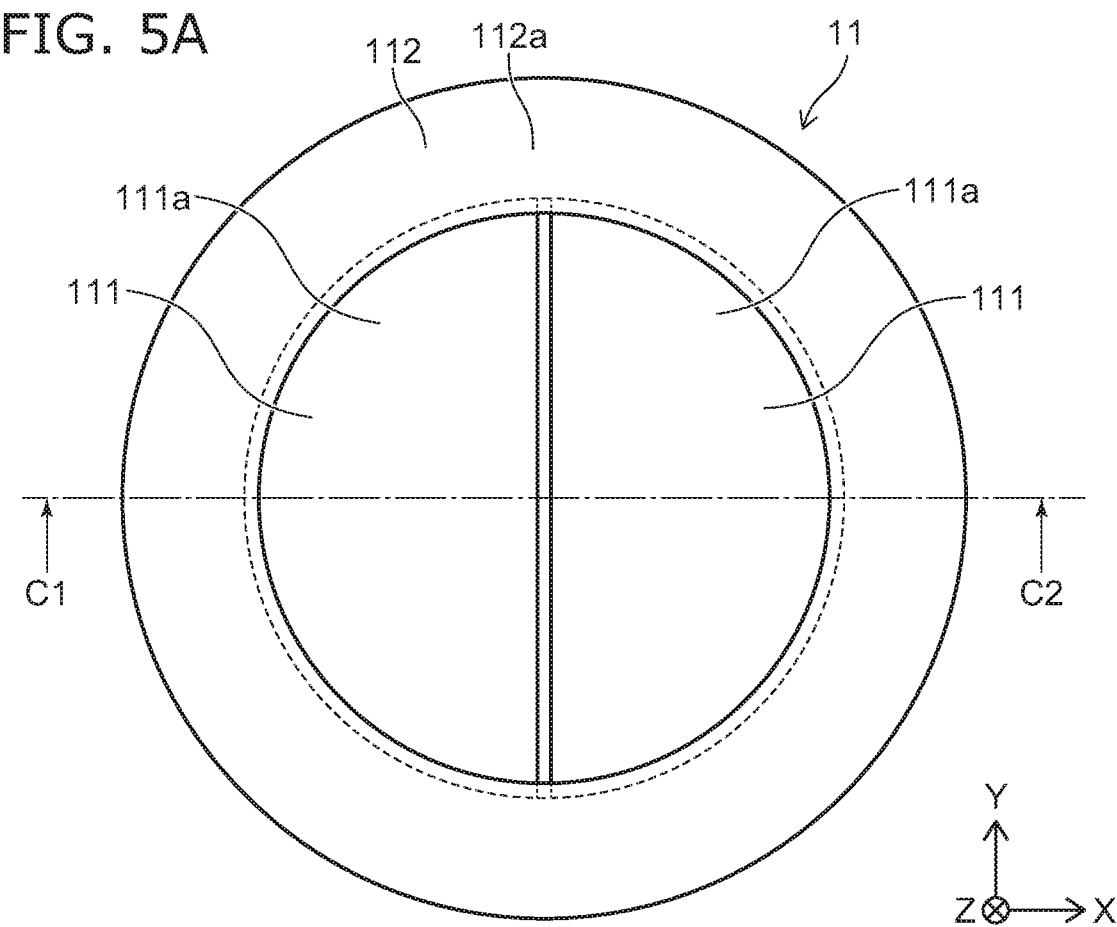
FIGS. 5A and 5B are a plan view and a cross-sectional view schematically illustrating another example of the first electrode layer of the electrostatic chuck according to the embodiment.
Figure 5B:
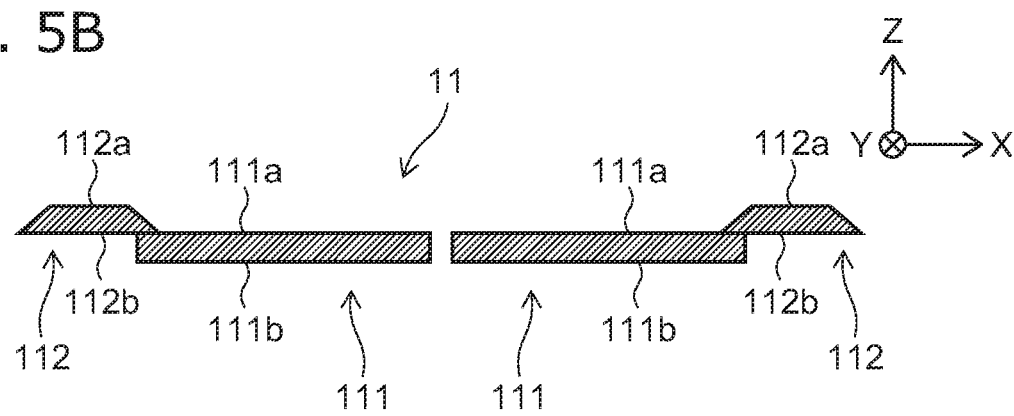

FIGS. 5A and 5B are a plan view and a cross-sectional view schematically illustrating another example of the first electrode layer of the electrostatic chuck according to the embodiment.

Region R1 shown in FIG. 1 is enlarged in FIG. 2.

FIG. 3B is a cross-sectional view along line A1-A2 shown in FIG. 3A. FIG. 4B is a cross-sectional view along line B1-B2 shown in FIG. 4A. FIG. 5B is a cross-sectional view along line C1-C2 shown in FIG. 5A.

The holes through which the gas inlet path 53 and the connection part 20 are inserted are not illustrated in FIGS. 3A, 3B, 4A, 4B, 5A, and 5B.

As illustrated in FIGS. 2, 3A, 3B, 4A, 4B, 5A, and 5B, the first electrode layer 11 includes a first portion 111 and a second portion 112. The first portion 111 is positioned at the center vicinity of the first electrode layer 11 when projected onto a plane (the X-Y plane) perpendicular to the Z-axis direction. The second portion 112 is positioned further toward the outer circumference side of the first electrode layer 11 than the first portion 111 when projected onto the plane perpendicular to the Z-axis direction. The first portion 111 is positioned more centrally of the ceramic dielectric substrate 10 than is the second portion 112. In other words, the first portion 111 is positioned inward in the X-Y plane, and the second portion 112 is positioned outward in the X-Y plane. For example, the first portion 111 is provided at a position overlapping the center of the electrostatic chuck 100 when projected onto the plane perpendicular to the Z-axis direction.

The first portion 111 includes a first surface 111a and a second surface 111b. The first surface 111a is the surface on the first major surface 10a side. The second surface 111b is the surface on the side opposite to the first surface 111a. In other words, the first surface 111a is the surface facing the second electrode layer 12. In other words, the second surface 111b is the surface on the second major surface 10b side. In the example, the first surface 111a and the second surface 111b are parallel to each other. Also, the first surface 111a and the second surface 111b each are parallel to the first major surface 10a.

In this specification, the state in which two surfaces are parallel can include, for example, the waviness of the surfaces, etc. For example, two surfaces can be considered to be "parallel" when the distance between the two surfaces is substantially constant when the cross section of the electrostatic chuck 100 is observed with a scanning electron microscope (SEM) or the like at a low magnification (e.g., about 100 times).

The second portion 112 includes a third surface 112a and a fourth surface 112b. The third surface 112a is the surface on the first major surface 10a side. The fourth surface 112b is the surface on the side opposite to the third surface 112a. In other words, the third surface 112a is the surface facing the second electrode layer 12. In other words, the fourth surface 112b is the surface on the second major surface 10b side.

The second portion 112 includes a central portion 112c and an end portion 112d (a circumferential end portion). The end portion 112d of the second portion 112 is a region including an edge 112e of the second portion 112 in the X-Y plane. The edge 112e of the second portion 112 is positioned in the third surface 112a or the fourth surface 112b and refers to the interface between the second portion 112 and the ceramic dielectric substrate 10 when viewed from the Z-axis direction. The central portion 112c of the second portion 112 is the region positioned between the two end portions 112d in the X-Y plane.

A distance D21 along the Z-axis direction between the fourth surface 112b and the first major surface 10a is constant. More specifically, a distance D21c along the Z-axis direction between the fourth surface 112b and the first major surface 10a at the central portion 112c of the second portion 112 is equal to a distance D21d along the Z-axis direction between the fourth surface 112b and the first major surface 10a at the end portion 112d of the second portion 112. That is, in the example, the fourth surface 112b is parallel to the first major surface 10a.

Here, "constant" can include, for example, the waviness of the fourth surface 112b, etc. For example, it is sufficient for the distance to be substantially constant when the cross section of the electrostatic chuck 100 is observed with a scanning electron microscope (SEM) or the like at a low magnification (e.g., about 100 times). The difference between the distance D21c and the distance D21d is, for example, 0±150 μm.

As illustrated in FIG. 2, the cross-sectional shape of the second portion 112 is upwardly convex. More specifically, a distance D22d along the Z-axis direction between the third surface 112a and the fourth surface 112b at the end portion 112d of the second portion 112 is less than a distance D22c along the Z-axis direction between the third surface 112a and the fourth surface 112b at the central portion 112c of the second portion 112. In other words, the distance D22c is the thickness (the second thickness) of the second portion 112 at the central portion 112c. In other words, the distance D22d is the thickness (the second thickness) of the second portion 112 at the end portion 112d. That is, the thickness of the second portion 112 at the end portion 112d is less than the thickness of the second portion 112 at the central portion 112c. For example, the thickness of the second portion 112 at the end portion 112d decreases from the central portion 112c side toward the edge 112e. The shape of the second portion 112 is convex at the third surface 112a side.

For example, the distance D22c and the distance D22d can be determined from a cross section SEM (Scanning Electron Microscope) image of the second portion 112. For example, the distance D22c can be determined as the average value of the thicknesses at three points in the central portion 112c. In this specification, the distance D22c is defined as the average value.

The third surface 112a is positioned between the first surface 111a and the second electrode layer 12 in the Z-axis direction. That is, the distance along the Z-axis direction between the first portion 111 (the first surface 111a) and the first major surface 10a is greater than the distance along the Z-axis direction between the second portion 112 (the third surface 112a) and the first major surface 10a. Accordingly, the distance between the first portion 111 (the first surface 111a) and the upper electrode is greater than the distance between the second portion 112 (the third surface 112a) and the upper electrode.

Thereby, the electric field strength can be reduced at the center vicinity (the first portion 111) of the first electrode layer 11 at which the electric field strength easily becomes strong compared to the outer circumference portion (the second portion 112) of the first electrode layer 11. In other words, the plasma density can be increased at the outer circumference portion (the second portion 112) of the first electrode layer 11 at which the plasma density easily becomes sparse compared to the center vicinity (the first portion 111) of the first electrode layer 11. Accordingly, the plasma controllability can be increased, and the in-plane uniformity of the plasma density in the first electrode layer 11 can be increased.

The high frequency current is supplied to the first electrode layer 11 from the surface on the second major surface 10b side (e.g., the second surface 111b, the fourth surface 112b, etc.). Normally, when an AC current flows through an electrode layer, a skin effect occurs in which the current density is high at the surface of the electrode layer and decreases away from the surface. The surface concentration of the current becomes pronounced as the high frequency of the AC current that flows increases. That is, the high frequency AC current that flows into the first electrode layer 11 from the surface on the second major surface 10b side (e.g., the second surface 111b, the fourth surface 112b, etc.) flows into the surface on the first major surface 10a side (e.g., the first surface 111a, the third surface 112a, etc.) via the surface on the second major surface 10b side of the first electrode layer 11 (e.g., the second surface 111b, the fourth surface 112b, etc.). If the skin effect at the first surface 111a is weak at this time, there are cases where the high frequency current supplied from the surface on the second major surface 10b side of the first electrode layer 11 (e.g., the second surface 111b, the fourth surface 112b, etc.) cannot flow all the way to the center of the first surface 111a, which is the surface on the first major surface 10a side of the first electrode layer 11; and the plasma density at the center vicinity of the first electrode layer 11 is not as expected. Also, the inventors discovered that there is a risk that electric field concentration and dielectric breakdown may occur at the end portion 112d of the second portion 112 at this time.

Conversely, in the embodiment, the occurrence of the electric field concentration at the end portion 112d of the second portion 112 can be suppressed by setting the distance D21 along the Z-axis direction between the fourth surface 112b and the first major surface 10a to be constant, and by setting the distance D22d along the Z-axis direction between the third surface 112a and the fourth surface 112b at the end portion 112d of the second portion 112 to be less than the distance D22c along the Z-axis direction between the third surface 112a and the fourth surface 112b at the central portion 112c of the second portion 112. The occurrence of the dielectric breakdown due to the electric field concentration at the end portion 112d of the second portion 112 can be suppressed thereby.

As illustrated in FIGS. 3A, 4A, and 5A, the first portion 111 may be monopolar or bipolar. When the first portion 111 is monopolar, one first portion 111 that spreads along the X-Y plane is provided as illustrated in FIGS. 3A and 4A. For example, the first portion 111 is substantially circular when viewed along the Z-axis direction. On the other hand, when the first portion 111 is bipolar, two first portions 111 that spread along the X-Y plane and are positioned to be coplanar are provided as illustrated in FIG. 5A. For example, the two first portions 111 each are substantially semicircular when viewed along the Z-axis direction.

As illustrated in FIGS. 3A, 3B, 4A, 4B, 5A, and 5B, for example, the second portion 112 has a ring configuration surrounding the first portion 111 when viewed along the Z-axis direction. In these examples, a portion of the second portion 112 overlaps the first portion 111 in the Z-axis direction. In these examples, the second portion 112 does not overlap the first portion 111 in the X-axis direction or the Y-axis direction. In these examples, the second portion 112 is electrically connected to the first portion 111. In these examples, the second portion 112 is directly connected to the first portion 111. In other words, the second portion 112 contacts the first portion 111. The arrangement of the first and second portions 111 and 112 is not limited thereto. Other examples of the arrangement of the first and second portions 111 and 112 are described below.

As illustrated in FIGS. 4A and 4B, the first electrode layer 11 may include one or more portions positioned further toward the outer circumference side of the first electrode layer 11 than the second portion 112 when projected onto the plane perpendicular to the Z-axis direction. In the example, the first electrode layer 11 further includes a third portion 113. The third portion 113 is positioned further toward the outer circumference side of the first electrode layer 11 than the second portion 112 when projected onto the plane perpendicular to the Z-axis direction.

The third portion 113 has a ring configuration surrounding the second portion 112 when viewed along the Z-axis direction. The cross-sectional shape of the third portion 113 is, for example, the same as the cross-sectional shape of the second portion 112.

The third portion 113 includes a fifth surface 113a and a sixth surface 113b. The fifth surface 113a is the surface on the first major surface 10a side. The sixth surface 113b is the surface on the side opposite to the fifth surface 113a. In other words, the fifth surface 113a is the surface facing the second electrode layer 12. In other words, the sixth surface 113b is the surface on the second major surface 10b side. In the example, the sixth surface 113b is parallel to the first major surface 10a. The fifth surface 113a is positioned between the third surface 112a and the second electrode layer 12 in the Z-axis direction.

FIGS. 6A to 6E are cross-sectional views illustrating examples of the arrangement of the first and second portions of the electrostatic chuck according to the embodiment.

As described above, it is sufficient for the first portion 111 and the second portion 112 to be disposed so that the third surface 112a of the second portion 112 is positioned between the second electrode layer 12 and the first surface 111a of the first portion 111 in the Z-axis direction; and the arrangement of the first and second portions 111 and 112 is modifiable as appropriate.

Figure 6A:
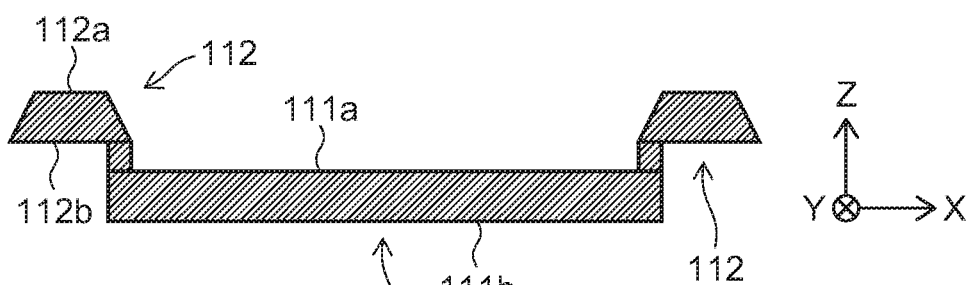
FIGS. 6A to 6E are cross-sectional views illustrating examples of the arrangement of the first and second portions of the electrostatic chuck according to the embodiment.
Figure 6B:
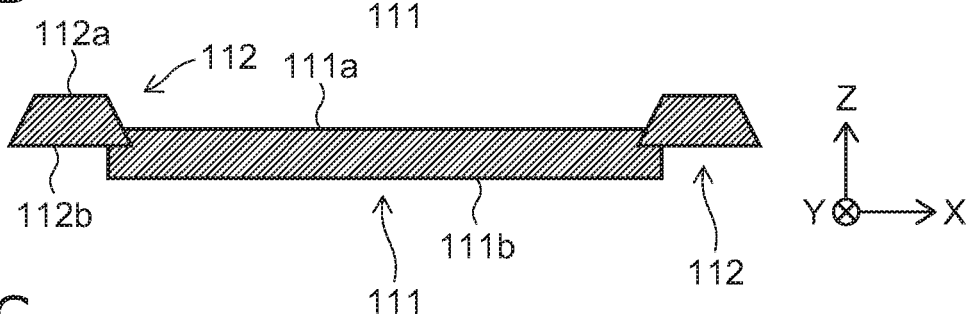
Figure 6C:
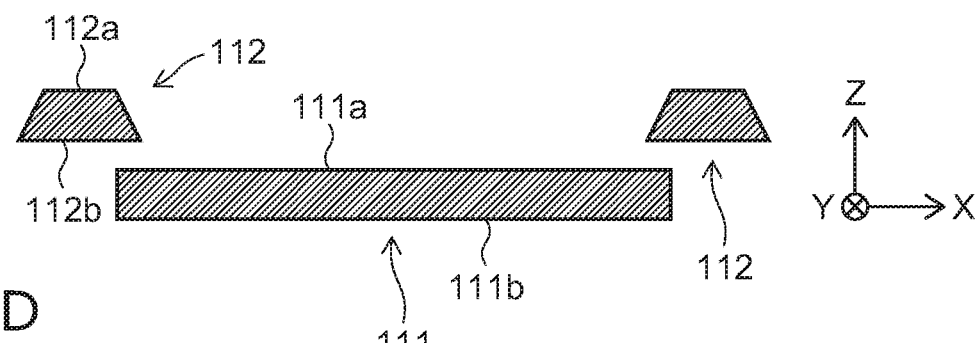
Figure 6D:
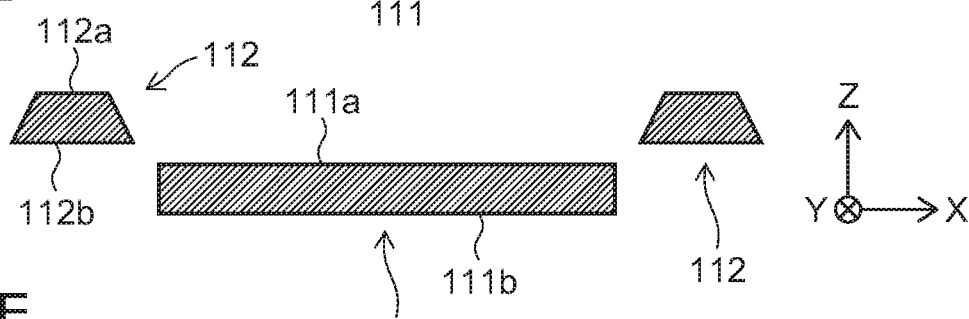
Figure 6E:
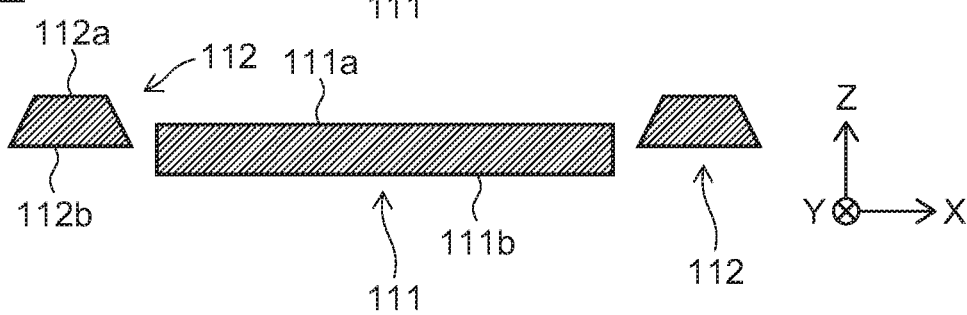

As illustrated in FIGS. 6A to 6C, a portion of the second portion 112 may overlap the first portion 111 in the Z-axis direction. As illustrated in FIGS. 6D and 6E, the second portion 112 may not overlap the first portion 111 in the Z-axis direction.

As illustrated in FIGS. 6B and 6E, a portion of the second portion 112 may overlap the first portion 111 in the X-axis direction or the Y-axis direction. As illustrated in FIGS. 6A, 6C, and 6D, the second portion 112 may not overlap the first portion 111 in the X-axis direction or the Y-axis direction.

As illustrated in FIGS. 6A and 6B, the second portion 112 may be electrically connected to the first portion 111. In such a case, the electrical connection between the first portion 111 and the second portion 112 may be a direct connection as illustrated in FIG. 6B or an indirect connection as illustrated in FIG. 6A. In other words, the first portion 111 and the second portion 112 may be electrically connected via a connection member made of a conductor. By electrically connecting the first portion 111 and the second portion 112, the first portion 111 and the second portion 112 can be collectively controlled.

As illustrated in FIGS. 6C, 6D, and 6E, the second portion 112 may not be electrically connected to the first portion 111. By not electrically connecting the first portion 111 and the second portion 112, the first portion 111 and the second portion 112 can be separately controlled.

In the examples of FIGS. 6A to 6E, the fourth surface 112b is positioned between the third surface 112a and the second surface 111b in the Z-axis direction. For example, the fourth surface 112b may be positioned in the same plane as the second surface 111b. Also, for example, the second surface 111b may be positioned between the third surface 112a and the fourth surface 112b in the Z-axis direction.

In the examples of FIGS. 6A to 6E, the distance along the Z-axis direction between the third surface 112a and the fourth surface 112b (the thickness of the second portion 112) is equal to the distance along the Z-axis direction between the first surface 111a and the second surface 111b (the thickness of the first portion 111). The thickness of the second portion 112 may be greater than the thickness of the first portion 111 or less than the thickness of the first portion 111.

FIGS. 7A and 7B are cross-sectional views schematically illustrating examples of the second portion of the electrostatic chuck according to the embodiment.

As illustrated in FIGS. 7A and 7B, the cross-sectional shape of the second portion 112 is not limited to the cross-sectional shape illustrated in FIG. 2. In the example of FIG. 2, the thickness of the second portion 112 at the central portion 112c is constant. In other words, the third surface 112a is parallel to the fourth surface 112b at the central portion 112c. On the other hand, at the end portion 112d, the thickness of the second portion 112 decreases from the central portion 112c side toward the edge 112e. In other words, at the end portion 112d, the third surface 112a includes a tilted surface that is tilted downward from the central portion 112c side toward the edge 112e. In the example of FIG. 2, the tilted surface is planar. The tilted surface may be curved as illustrated in FIG. 7A.

As illustrated in FIG. 7B, the third surface 112a may include a tilted surface that is tilted downward from the center of the third surface 112a in the X-Y plane toward the edge 112e. In other words, the thickness of the second portion 112 may not be constant at the central portion 112c. That is, the third surface 112a may not be parallel to the fourth surface 112b at the central portion 112c. In such a case, the tilted surface may be curved as illustrated in FIG. 7B.

Figure 8A:
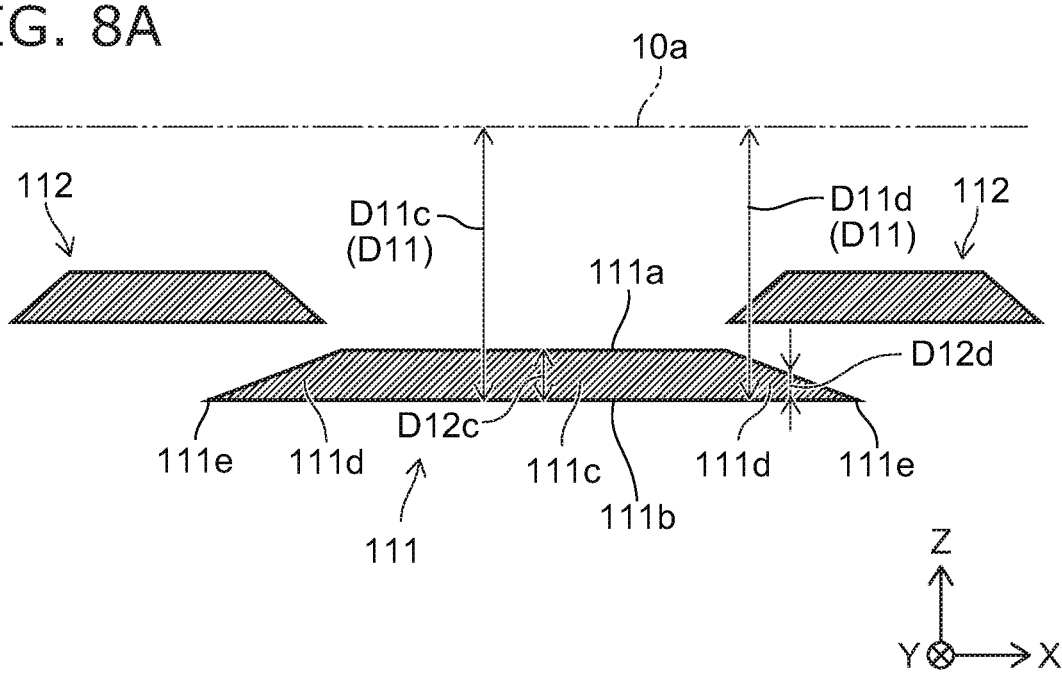
FIGS. 8A and 8B are cross-sectional views schematically illustrating examples of the first electrode layer of the electrostatic chuck according to the embodiment.
Figure 8B:
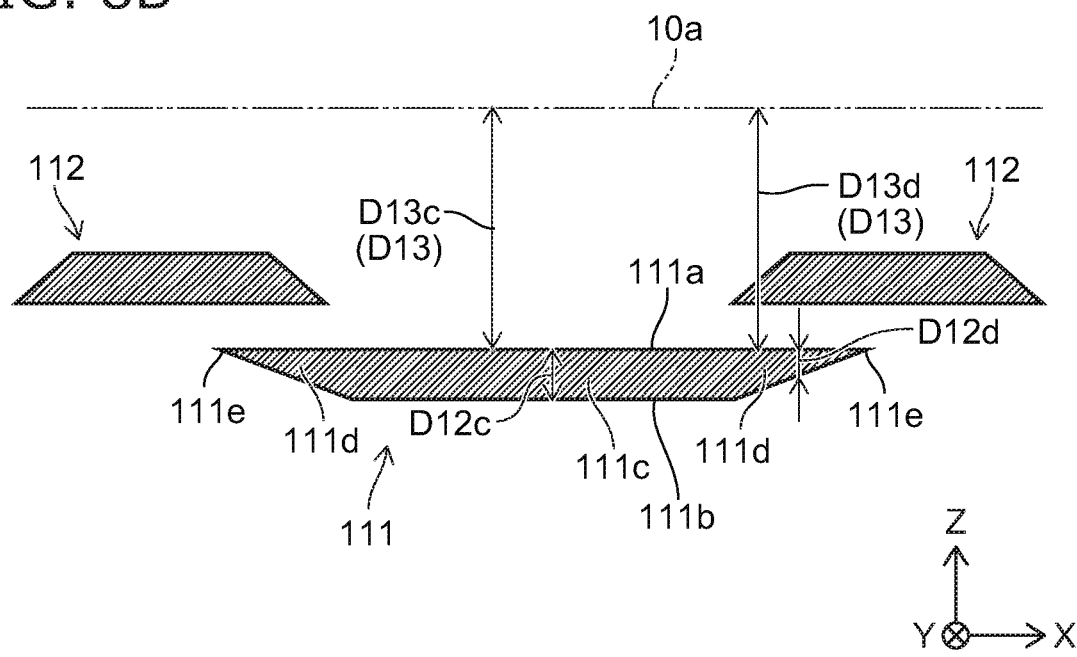

FIGS. 8A and 8B are cross-sectional views schematically illustrating examples of the first electrode layer of the electrostatic chuck according to the embodiment.

FIGS. 9A, 9B, 10A, and 10B are cross-sectional views schematically illustrating examples of the first portion of the electrostatic chuck according to the embodiment.

As illustrated in FIGS. 8A and 8B, the first portion 111 includes, for example, a central portion 111c and an end portion 111d. The end portion 111d of the first portion 111 is a region including an edge 111e of the first portion 111 in the X-Y plane. The edge 111e of the first portion 111 is positioned in the first surface 111a or the second surface 111b and refers to the interface between the first portion 111 and the ceramic dielectric substrate 10 when viewed from the Z-axis direction. The central portion 111c of the first portion 111 is a region positioned between the two end portions 111d in the X-Y plane.

In the example illustrated in FIG. 8A, a distance D11 along the Z-axis direction between the second surface 111b and the first major surface 10a is constant. More specifically, a distance D11c along the Z-axis direction between the second surface 111b and the first major surface 10a at the central portion 111c of the first portion 111 is equal to a distance D11d along the Z-axis direction between the second surface 111b and the first major surface 10a at the end portion 111d of the first portion 111. That is, in the example, the second surface 111b is parallel to the first major surface 10a.

Here, "constant" can include, for example, the waviness of the second surface 111b, etc. For example, it is sufficient for the distance to be substantially constant when the cross section of the electrostatic chuck 100 is observed with a scanning electron microscope (SEM) or the like at a low magnification (e.g., about 100 times). The difference between the distance D11c and the distance D11d is, for example, 0±150 µm.

On the other hand, in the example as illustrated in FIG. 8A, the first surface 111a is not parallel to the first major surface 10a. In the example, the cross-sectional shape of the first portion 111 is upwardly convex. More specifically, a distance D12d along the Z-axis direction between the first surface 111a and the second surface 111b at the end portion 111d of the first portion 111 is, for example, less than a distance D12c along the Z-axis direction between the first surface 111a and the second surface 111b at the central portion 111c of the first portion 111. In other words, the distance D12c is the thickness (the first thickness) of the first portion 111 at the central portion 111c. In other words, the distance D12d is the thickness (the first thickness) of the first portion 111 at the end portion 111d. That is, the thickness of the first portion 111 at the end portion 111d is less than the thickness of the first portion 111 at the central portion 111c. The shape of the first portion 111 is convex at the first surface 111a side.

For example, the distance D12c and the distance D12d can be determined from a cross section SEM (Scanning Electron Microscope) image of the first portion 111. For example, the distance D12c can be determined as the average value of thicknesses at three points in the central portion 111c. In this specification, the distance D12c is defined as this average value.

Thus, the occurrence of the electric field concentration at the end portion 111d of the first portion 111 can be suppressed by setting the distance D11 along the Z-axis direction between the second surface 111b and the first major surface 10a to be constant, and by setting the distance D12d along the Z-axis direction between the first surface 111a and the second surface 111b at the end portion 111d of the first portion 111 to be less than the distance D12c along the Z-axis direction between the first surface 111a and the second surface 111b at the central portion 111c of the first portion 111. The occurrence of the dielectric breakdown due to the electric field concentration at the end portion 111d of the first portion 111 can be further suppressed thereby.

Figure 9A:
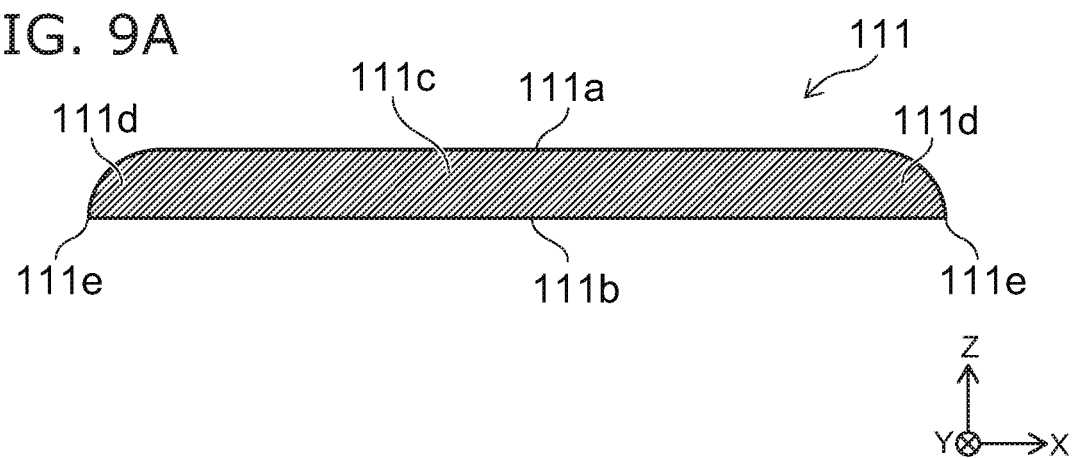
FIGS. 9A and 9B are cross-sectional views schematically illustrating examples of the first portion of the electrostatic chuck according to the embodiment.

The cross-sectional shape of the second portion 112 is not limited to the cross-sectional shape illustrated in FIG. 8A. In the example of FIG. 8A, the thickness of the first portion 111 is constant at the central portion 111c. In other words, the first surface 111a is parallel to the second surface 111b at the central portion 111c. On the other hand, at the end portion 111d, the thickness of the first portion 111 decreases from the central portion 111c side toward the edge 111e. In other words, at the end portion 111d, the first surface 111a includes a tilted surface that is tilted downward from the central portion 111c side toward the edge 111e. In the example of FIG. 8A, the tilted surface is planar. The tilted surface may be curved as illustrated in FIG. 9A.

Figure 9B:
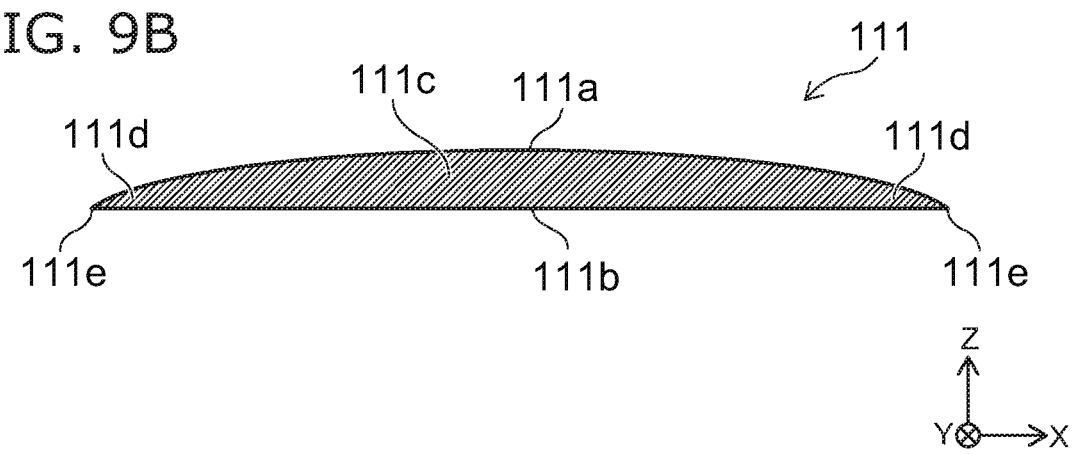

As illustrated in FIG. 9B, the first surface 111a may include a tilted surface that is tilted downward from the center of the first surface 111a in the X-Y plane toward the edge 111e. In other words, the thickness of the first portion 111 may not be constant at the central portion 111c. That is, the first surface 111a may not be parallel to the second surface 111b at the central portion 111c. In such a case, the tilted surface may be curved as illustrated in FIG. 9B.

In the example illustrated in FIG. 8B, a distance D13 along the Z-axis direction between the first surface 111a and the first major surface 10a is constant. More specifically, a distance D13c along the Z-axis direction between the first surface 111a and the first major surface 10a at the central portion 111c of the first portion 111 is equal to a distance D13d along the Z-axis direction between the first surface 111a and the first major surface 10a at the end portion 111d of the first portion 111. That is, in the example, the first surface 111a is parallel to the first major surface 10a.

Here, "constant" can include, for example, the waviness of the first surface 111a, etc. For example, it is sufficient for the distance to be substantially constant when the cross section of the electrostatic chuck 100 is observed with a scanning electron microscope (SEM) or the like at a low magnification (e.g., about 100 times). The difference between the distance D13c and the distance D13d is, for example, 0±150 µm.

On the other hand, in the example as illustrated in FIG. 8B, the second surface 111b is not parallel to the first major surface 10a. In the example, the cross-sectional shape of the first portion 111 is downwardly convex. More specifically, the distance D12d along the Z-axis direction between the first surface 111a and the second surface 111b at the end portion 111d of the first portion 111 (i.e., the thickness of the first portion 111 at the end portion 111d) is less than the distance D12c along the Z-axis direction between the first surface 111a and the second surface 111b at the central portion 111c of the first portion 111 (i.e., the thickness of the first portion 111 at the central portion 111c). The shape of the first portion 111 is convex at the second surface 111b side.

Thus, the distance D13 along the Z-axis direction between the first surface 111a and the first major surface 10a is set to be constant, and the distance D12d along the Z-axis direction between the first surface 111a and the second surface 111b at the end portion 111d of the first portion 111 is set to be less than the distance D12c along the Z-axis direction between the first surface 111a and the second surface 111b at the central portion 111c of the first portion 111; thereby, the surface area of the second surface 111b of the first portion 111, which is positioned at the base plate 50 side which has a cooling function, can be relatively large. Thereby, the first electrode layer 11 can dissipate heat more effectively, and the in-plane uniformity of the plasma density can be increased further. Also, the power supply distance from the second surface 111b to the first surface 111a can be shortened. Thereby, the responsiveness (the RF responsiveness) to a control such as a modification of the RF output, etc., can be increased.

The cross-sectional shape of the second portion 112 is not limited to the cross-sectional shape illustrated in FIG. 8B. In the example of FIG. 8B, the thickness of the first portion 111 is constant at the central portion 111c. In other words, the second surface 111b is parallel to the first surface 111a at the central portion 111c. On the other hand, at the end portion 111d, the thickness of the first portion 111 decreases from the central portion 111c side toward the edge 111e. In other words, at the end portion 111d, the second surface 111b includes a tilted surface that is tilted upward from the central portion 111c side toward the edge 111e. In the example of FIG. 8B, the tilted surface is planar. The tilted surface may be curved as illustrated in FIG. 10A.

As illustrated in FIG. 10B, the second surface 111b may include a tilted surface that is tilted upward from the center of the second surface 111b in the X-Y plane toward the edge 111e. In other words, the thickness of the first portion 111 may not be constant at the central portion 111c. That is, the second surface 111b may not be parallel to the first surface 111a at the central portion 111c. In such a case, the tilted surface may be curved as illustrated in FIG. 10B.

A method for making the ceramic dielectric substrate 10 in which the first electrode layer 11 and the second electrode layer 12 are embedded will now be described.

For example, the ceramic dielectric substrate 10 in which the first electrode layer 11 and the second electrode layer 12 are embedded may be made by sintering as a continuous body in a state in which the first electrode layer 11 and the second electrode layer 12 are inside the ceramic dielectric substrate 10.

For example, the first electrode layer 11 (the first portion 111 and the second portion 112) is formed by screen printing, paste coating (spin coating, a coater, inkjet, a dispenser, etc.), vapor deposition, etc. For example, the first electrode layer 11 can be formed by separately performing multiple stacking of the layers in a state in which the first major surface 10a is down. At this time, for example, the relationship between the distance D22d between the third surface 112a and the fourth surface 112b at the end portion 112d and the distance D22c between the third surface 112a and the fourth surface 112b at the central portion 112c can be set to satisfy D22d<D22c by adjusting the stacking area, etc.

FIG. 11 is a cross-sectional view schematically illustrating a wafer processing apparatus including the electrostatic chuck according to the embodiment.

As illustrated in FIG. 11, the wafer processing apparatus 500 includes the processing container 501, the high frequency power supply 504, the clamping power supply 505, the upper electrode 510, and the electrostatic chuck 100. The upper electrode 510 and a processing gas inlet 502 for introducing a processing gas to the interior are provided at the ceiling of the processing container 501. An exhaust port 503 for evacuating the interior is provided at the bottom plate of the processing container 501. The electrostatic chuck 100 is disposed under the upper electrode 510 inside the processing container 501. The upper electrode 510 and the first electrode layer 11 of the electrostatic chuck 100 are connected to the high frequency power supply 504. The second electrode layer 12 of the electrostatic chuck 100 is connected to the clamping power supply 505.

The upper electrode 510 and the first portion 111 of the first electrode layer 11 are provided to be substantially parallel and separated from each other by a prescribed spacing. More specifically, the first surface 111a of the first portion 111 is substantially parallel to a lower surface 510a of the upper electrode 510. Also, the first major surface 10a of the ceramic dielectric substrate 10 is substantially parallel to the lower surface 510a of the upper electrode 510. The clamping object W is placed on the first major surface 10a positioned between the first electrode layer 11 and the upper electrode 510.

When a voltage (a high frequency voltage) is applied to the electrode layer 110 and the upper electrode 510 from the high frequency power supply 504, high frequency electric discharge occurs; the processing gas that is introduced to the processing container 501 is excited by the plasma and activated; and the clamping object W is processed.

When a voltage (a clamping voltage) is applied to the electrode layer 110 from the clamping power supply 505, a charge is generated at the first major surface 10a side of the electrode layer 110; and the clamping object W is held to the electrostatic chuck 100A by an electrostatic force.

According to the embodiments as described above, an electrostatic chuck can be provided in which the in-plane uniformity of the plasma density in the first electrode layer can be increased, and the occurrence of dielectric breakdown due to electric field concentration in the first electrode layer can be suppressed.

Hereinabove, embodiments of the invention are described. However, the invention is not limited to these descriptions. Appropriate design modifications made by one skilled in the art for the embodiments described above also are within the scope of the invention to the extent that the features of the invention are included. For example, the configurations, the dimensions, the materials, the arrangements, the mounting methods, etc., of the components included in the electrostatic chuck are not limited to those illustrated and can be modified appropriately.

Also, the components included in the embodiments described above can be combined within the limits of technical feasibility; and such combinations are within the scope of the invention to the extent that the features of the invention are included.

What is claimed is:

1. An electrostatic chuck, comprising:
a ceramic dielectric substrate including a first major surface and a second major surface, the first major surface being configured to have an object placed thereon and clamped by the electrostatic chuck, the second major surface being at a side opposite to the first major surface;
a base plate supporting the ceramic dielectric substrate;
at least one plasma-generating electrode layer provided inside the ceramic dielectric substrate and connected to a high frequency power supply from a side of the second major surface; and
at least one clamping electrode layer provided inside the ceramic dielectric substrate and connected to a clamping power supply,
the plasma-generating electrode layer being provided between the first major surface and the second major surface in a Z-axis direction extending from the base plate toward the ceramic dielectric substrate,
the clamping electrode layer being provided between the plasma-generating electrode layer and the first major surface in the Z-axis direction,
the plasma-generating electrode layer including a first portion and second portion, the first portion having a first thickness and being positioned more centrally of the ceramic dielectric substrate than is the second portion when projected onto a plane perpendicular to the Z-axis direction,
the first portion including a first surface at a side of the first major surface, and a second surface at a side opposite to the first surface,
the second portion including a third surface at the side of the first major surface, and a fourth surface at a side opposite to the third surface,
the third surface being positioned between the first surface and the clamping electrode layer in the Z-axis direction,
a distance along the Z-axis direction between the fourth surface and the first major surface being constant, and
a second thickness of the second portion of the plasma-generating electrode layer in the Z-axis direction, between the third surface and the fourth surface, varying such that the second thickness at a circumferential end portion of the second portion is less than the second thickness at a central portion of the second portion, whereby the plasma-generating electrode layer is configured to optimize distribution of plasma density in order to provide substantially uniform plasma density therein during use.

2. The chuck according to claim 1, wherein a distance along the Z-axis direction between the second surface and the first major surface is constant, and the first thickness of the first portion in the Z-axis direction, between the first surface and the second surface, varies such that the first thickness at a circumferential end portion of the first portion is less than the first thickness at a central portion of the first portion.

3. The chuck according to claim 1, wherein a distance along the Z-axis direction between the first surface and the first major surface is constant, and the first thickness of the first portion in the Z-axis direction, between the first surface and the second surface, varies such that the first thickness at a circumferential end portion of the first portion is less than the first thickness at a central portion of the first portion.

* * * * *